(12) United States Patent
Su et al.

(10) Patent No.: US 9,564,264 B2
(45) Date of Patent: Feb. 7, 2017

(54) HIGH FREQUENCY INTEGRATED POINT-OF-LOAD POWER CONVERTER WITH EMBEDDED INDUCTOR SUBSTRATE

(71) Applicant: Virginia Tech Intellectual Properties, Inc., Blacksburg, VA (US)

(72) Inventors: Yipeng Su, Blacksburg, VA (US); Qiang Li, Blacksburg, VA (US); Fred C. Lee, Blacksburg, VA (US); Wenli Zhang, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 291 days.

(21) Appl. No.: 14/177,531

(22) Filed: Feb. 11, 2014

(65) Prior Publication Data

US 2015/0062989 A1    Mar. 5, 2015

Related U.S. Application Data

(60) Provisional application No. 61/872,212, filed on Aug. 30, 2013.

(51) Int. Cl.
| | |
|---|---|
| H05K 7/02 | (2006.01) |
| H01F 17/00 | (2006.01) |
| H05K 1/03 | (2006.01) |
| H02M 3/155 | (2006.01) |

(Continued)

(52) U.S. Cl.
CPC ........ *H01F 17/0033* (2013.01); *H05K 1/0373* (2013.01); *H01F 2017/008* (2013.01); *H02M 3/155* (2013.01); *H05K 1/0233* (2013.01); *H05K 1/165* (2013.01); *H05K 2201/0209* (2013.01);

(Continued)

(58) Field of Classification Search
CPC .......................... H05K 1/0373; H01F 17/0033
See application file for complete search history.

(56) References Cited

U.S. PATENT DOCUMENTS

| | | | | |
|---|---|---|---|---|
| 2009/0167477 | A1* | 7/2009 | Feng ................... | H01F 17/0033 336/200 |
| 2011/0050191 | A1* | 3/2011 | Tsuji .................. | H01F 17/0006 323/282 |

OTHER PUBLICATIONS

Li et al.; "High Inductance Density Low-Profile Inductor Structure for Integrated Point-of-Load Converter"; Applied Power Electronics Conference and Exposition, 2009. APEC 2009. Twenty-Fourth Annual IEEE; Feb. 15-19, 2009, pp. 1011-1017.

* cited by examiner

*Primary Examiner* — Jue Zhang
(74) *Attorney, Agent, or Firm* — Whitham, Curtis & Cook, P.C.

(57) ABSTRACT

A low profile power converter structure is provide wherein volume is reduced and power density is increased to approach 1 KW/in³ by at least one of forming an inductor as a body of magnetic material embedded in a substrate formed by a plurality of printed circuit board (PCB) lamina and forming inductor windings of PCB cladding and vias which may be of any desired number of turns and may include inversely coupled windings and which provide a lateral flux path, forming the body of magnetic material from high aspect ratio flakes of magnetic material which are aligned with the inductor magnetic field in an insulating organic binder and hot-pressed and providing a four-layer architecture comprising two layers of PCB lamina including the embedded body of magnetic material, a shield layer and an additional layer of PCB lamina, including cladding for supporting and connecting a switching circuit, a capacitor and the inductor.

20 Claims, 5 Drawing Sheets

(51) Int. Cl.
*H05K 1/02* (2006.01)
*H05K 1/16* (2006.01)
(52) U.S. Cl.
CPC . *H05K 2201/0245* (2013.01); *H05K 2201/086* (2013.01); *H05K 2201/10015* (2013.01)

Vertical Flux

Lateral Flux

Top view    Bottom view

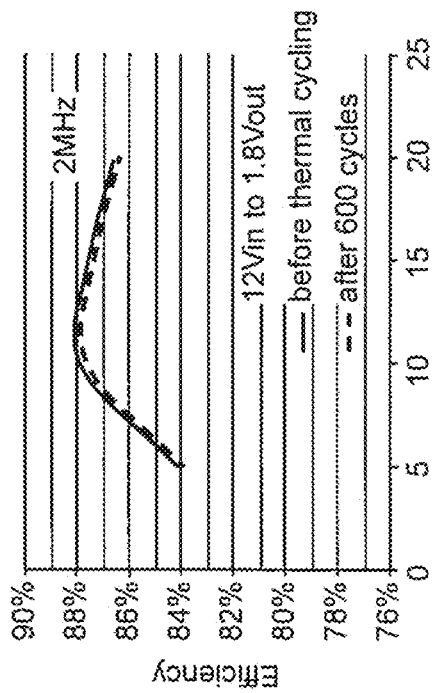
Figure 10
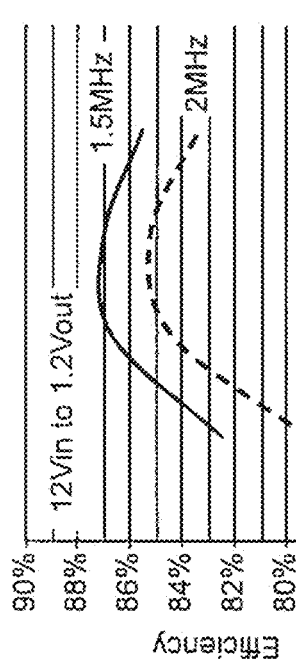
Figure 9
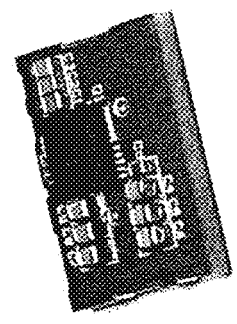
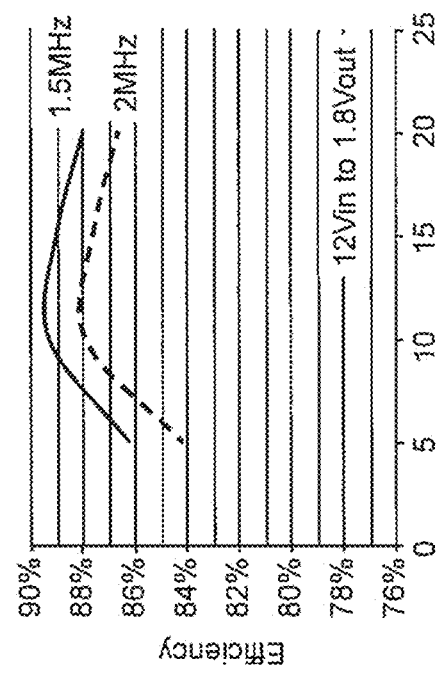
Figure 12
Figure 11

HIGH FREQUENCY INTEGRATED POINT-OF-LOAD POWER CONVERTER WITH EMBEDDED INDUCTOR SUBSTRATE

CROSS-REFERENCE TO RELATED APPLICATIONS

This application claims benefit of priority of U.S. Provisional Application 61/872,212, filed Aug. 30, 2013, which is hereby incorporated by reference in its entirety.

FIELD OF THE INVENTION

The present invention generally relates to point-of-load (POL) power converters and, more particularly, POL power converters having very high power density as is particularly desirable for portable electronic devices.

BACKGROUND OF THE INVENTION

Virtually all electronic devices operate on power which must be of substantially constant, if not very closely regulated voltage and thus require a power supply capable of delivering power at such voltage(s), often at relatively high current. However, in many such devices, current can fluctuate very rapidly. The voltages required can also differ widely between such devices and within a given device. For example, modern microprocessor chips, when operating at full clock speeds may require hundreds of amperes at a fraction of a volt on a given chip and yet require voltages of several volts to communicate between chips while presenting a very light load and draw low current levels when in an idle or stand-by state while being able to shift between idle of stand-by states and full operation very quickly and often. Similarly, memory chips generally require little power during normal operation but may require substantial power for periodic refresh which must be performed rapidly and often.

The increasing popularity of portable devices such as laptop computers, smart phones, personal digital assistants and panel type computers, particularly of the hand-held type, has put increasing demands on the design and manufacture of power supplies, generally referred to as power converters, voltage regulators or the like. For such devices, small size, light weight and a high level of functionality are extremely desirable. Therefore, it is considered imperative to develop and use power converters for such devices that are as small and light weight as possible since the power converter(s) do not directly contribute to the ultimate functionality of the device. Conversely, the need for limitation of size and increase of power density of power converters is, if anything, greater than the need for size limitation and increased functionality in such devices since any volume reduction in the required power converter(s) can be used for providing increased functionality of the portable device.

Additionally, the requirement for close voltage regulation at very low voltages and very high currents has led to the concept of point-of-load power converters so that the power connections may be kept very short to limit voltage drop in the power connections and the impact of parasitics and to limit the propagation time of signals from the load to control operation of the power converter. Since the semiconductor chips and other loads may be very small, there is increased pressure to produce power converters of comparable sizes in order to place them as closely as possible to the device being powered.

Additionally, among the many power converter topologies that are known, resonant converters and/or so-called buck/boost converters, in particular, have drawn substantial interest for portable devices. While these topologies are not of minimal complexity, they are still favored for efficiency and the ability to extract more power from rechargeable battery power sources since they can regulate their outputs at voltages above the voltage of the input power source which diminishes as battery charge is drawn down.

While much effort has been expended in recent years to provide power converters of reduced size and increased power density, none has satisfied all power converter requirements for hand-held devices of current and foreseeable designs. For example, chip level integration placing a magnetic core and winding on a silicon substrate is applicable only to power converters limited in output current to below one ampere which is adequate for some hand-held devices but not for others such as netbooks and tablets. Thus, system level integration is preferred for high current POL modules. Very high frequency switching devices based on gallium nitride (GaN) combined with low temperature co-fired ceramic (LTCC) ferrite inductor substrates have reached power densities of 1 Kw/in$^3$ but are too expensive, the technology of GaN devices is not sufficiently mature and the high temperatures (~900° C.) required for sintering ferrite materials complicates manufacturing and raises costs too greatly for high volume manufacture.

SUMMARY OF THE INVENTION

It is therefore an object of the present invention to provide a power converter structure capable of providing power to any type of current or foreseeable portable electronic device.

It is another object of the invention to provide a low profile power converter structure that can be mass produced having a power density approaching 1 kW/in$^3$ with components involving only mature technologies that are known to be reliable and which can be assembled using known techniques.

It is another object of the invention to provide a power converter structure in which the volume occupied by the inductor is minimized.

In order to accomplish these and other objects of the invention, a power converter is provided comprising a switching circuit, a capacitor, and an inductor formed of a body of magnetic material embedded in a laminated printed circuit board structure and windings formed by vias connected to areas of cladding on surfaces of the laminated printed circuit board structure.

In accordance with another aspect of the invention, a power converter is provided comprising a switching circuit, a capacitor, and an inductor including a body of magnetic material comprised of a composite formed of flaked magnetic material that has been coated with SiO$_2$ and hot pressed with an organic binder.

In accordance with a further aspect of the invention, a power converter having a four-layer architecture is provided comprising a lower layer comprising an inductor core laminated between two printed circuit board layers, a shielding layer extending over the lower layer, and an upper layer comprising a further printed circuit board lamina with patterned cladding and supporting switching transistors and at least one capacitor.

These three aspects of the invention can be used in any combination and, when all of these aspects of the invention are used together, provide a power converter structure having a power density closely approaching 2 KW/in$^3$ when operating at switching frequencies of 1.5-2 MHZ which is easily achieved with commercially available and mature technologies suitable for mass production.

BRIEF DESCRIPTION OF THE DRAWINGS

The foregoing and other objects, aspects and advantages will be better understood from the following detailed description of a preferred embodiment of the invention with reference to the drawings, in which:

FIG. 9 is a photographic size comparison of a power converter module in accordance with the invention with a familiar coin, FIGS. 10 and 11 are graphic comparisons of efficiencies of power converters in accordance with the invention when operated at different frequencies at respective output voltages, and FIG. 12 is a graphic comparison of the efficiency of a power converter in accordance with the invention before and after and industry standard thermal cycling test.

DETAILED DESCRIPTION OF A PREFERRED EMBODIMENT OF THE INVENTION

Figure 1A:
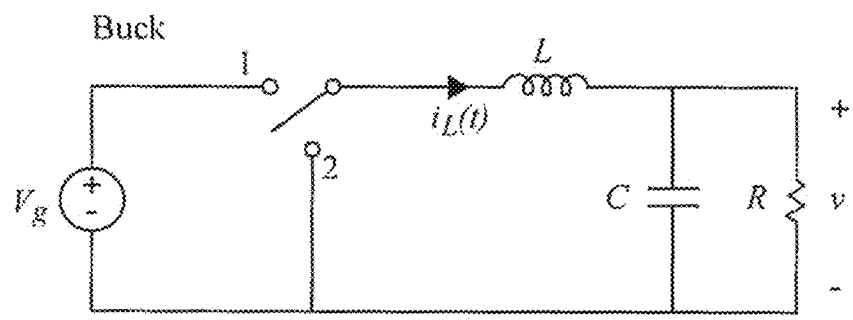
FIGS. 1A, 1B and 1C are schematic diagrams of exemplary power converter topologies.
Figure 1B:
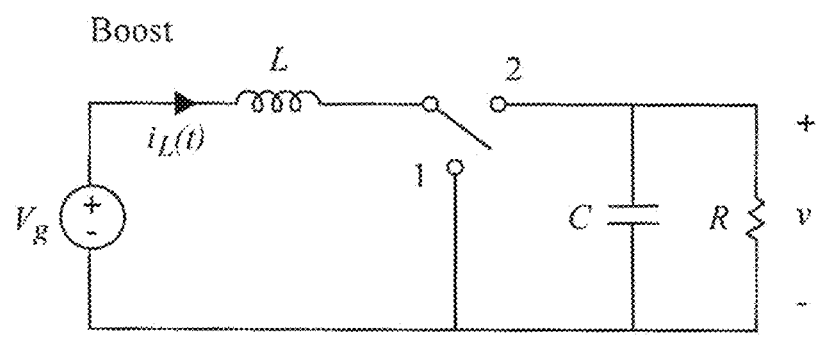
Figure 1C:
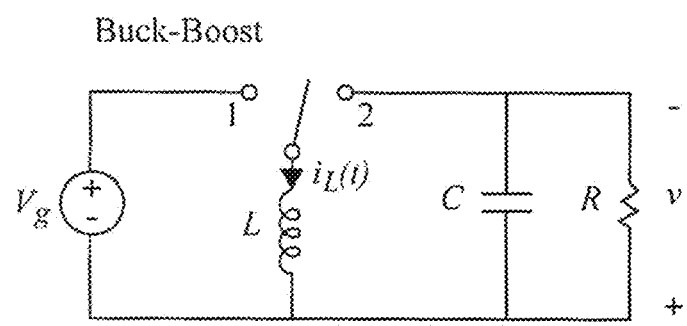

Referring now to the drawings, and more particularly to FIGS. 1A-1C, there are shown schematic diagrams of three exemplary basic types of power converter topologies that can be implemented in accordance with the invention. While the modes of operation of these topologies are well-known, many variants of the actual circuits have been developed to which the invention is also applicable. The invention is also applicable to any other power converter topology as long as the magnetic components are included, whether currently known or foreseeable.

It should be understood that the schematic diagrams of FIGS. 1A-1C are simplified to the minimum required components for each topology and are arranged to facilitate conveyance of an understanding of the invention and the problems for which the invention provides a solution. Therefore, no portion of any of FIGS. 1A-1C is admitted to be prior art as to the present invention. Therefore these Figures have been labeled as "Related Art".

The buck converter illustrated in FIG. 1A is utilized where an output voltage lower than the power supply voltage is required by the load (depicted as a resistor, R, in each of FIGS. 1A-1C). This function is achieved by locating the inductor relative to the switch (which is usually embodied by two or four transistors which are controlled to be alternately conductive) such that increasing and decreasing currents through the inductor as the power supply is connected and disconnected develop voltages that oppose the power supply voltage when connected and cause so-called freewheel current when the power supply is disconnected. At the present time, this topology is possibly the most popular for inclusion in portable electronic devices.

The boost power converter topology illustrated in FIG. 1B is most applicable to devices that require power to be supplied at an output voltage that is greater than the power supply to the power converter. This function is achieved by repeatedly drawing a substantial current by being directly connected across the power supply to store energy in the inductor and then connecting the inductor to the output filter (represented by capacitor, C, in FIGS. 1A-1C) and the load. Since the current in the capacitor will decrease quickly when it is disconnected from the power source, the inductor develops a voltage which can be much higher than the input voltage source. That is, the inductor is charged by the source voltage and discharges by the voltage difference between the load and the source. The load voltage should be higher than the source voltage in order to achieve a voltage-second balance on the inductor in each switching cycle. Since the inductor remains connected to the input power source when the inductor is connected to the filter the voltage applied to the filter will be the sum of the power source voltage and the inductor voltage. This power converter topology is substantially less popular for inclusion in portable electronic devices than the buck converter of FIG. 1A but is indispensable for some applications.

The buck-boost power converter topology illustrated in FIG. 1C can deliver power at an output voltage that can be either lower or higher than the input power source voltage. This function is achieved, in the circuit shown, by storing energy in the inductor in much the same manner as in the boost topology described above. The inductor is charged by the source voltage and discharged by the source voltage alternately in each switching cycle. To achieve a voltage-second balance, when the load voltage is below the source voltage, the duty cycle will be less than 0.5; otherwise, when the load voltage is greater than the source voltage, the duty cycle is greater than 0.5. The load voltage has an opposite polarity with respect to the source voltage. There is rapidly growing interest in this topology since it can extract more power from a power storage device such as a rechargeable battery that exhibits a decrease in voltage as power is drawn therefrom. Therefore, this topology can provide power for longer periods of operation for a single battery charge. Such a function can also be exploited to permit a reduction in the size, weight and cost of a rechargeable battery for a portable or hand-held device.

It should be appreciated from the above discussion that, while the different power converter topologies operate very differently and have different functions and characteristics, they are all constituted by exactly the same basic components which are interconnected in different ways: a switch, usually comprised of either a two transistor half-bridge circuit of a four transistor full bridge circuit, an inductor, an output filter capacitor (sometimes referred to as an input capacitor in point-of-load power converters since it is electrically and physically located at the input to the load), all of which require significant volume, input and output terminals and connections between the switch, inductor and capacitor. The connections and input and output connections generally represent negligible volume but require at least some area on a substrate which must also be provided to support these components and their interconnections and thus allow the components to be integrated into a small, low profile power converter module.

To reduce power converter size and increase power density and volume and to provide a generally planar shape of minimal thickness as dictated by the desirable low profile shape of portable and hand-held devices, reduction of the volume of these components must be considered. However, capacitors of minimal size are commercially available and no significant reduction in volume is possible with capacitors of currently known and mature technologies. Similarly, transistors suitable for power converter switches are known and commercially available either as discrete components or integrated half bridge or full bridge circuit packages which will be of a size that is designed to be minimal for anticipated heat dissipation requirements or ratings. Therefore, the remaining candidates for volume and dimensional reduction and integration with improved efficiency of space utilization while maintaining or enhancing operational efficiency without requiring technologies that are not mature are the inductor, the magnetic material of the inductor and the substrate.

Since most power converters of current design use printed circuit boards (PCBs) to support the components, the technology of printed circuit board (including so-called multi-layer and double-sided PCB) manufacture and electronic device manufacture on PCBs are both highly mature technologies. Since multi-layer PCBs are laminated structures, they can include embedded components such as wiring. It has been found by the inventors that a magnetic core can also be embedded in a PCB structure without requiring any process which is incompatible with known production processes for conventional PCBs. Moreover, when the magnetic core material is embedded by sandwiching it between lamina of the PCB, the windings for the inductor can be formed of the metal (e.g. copper) cladding layers on both outer sides of the PCB or between PCB lamina together with vias through the magnetic core material (also a very mature technology) to form an inductor of very low profile. This type of structure also essentially removes the volume and footprint of the inductor from the total substrate area and the total volume of the integrated power converter module in accordance with the invention as well as avoiding wasted space between the inductor and other components supported by the substrate.

Figure 2A:
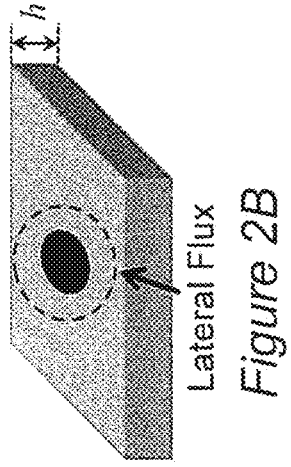
FIGS. 2A and 2B are schematic illustrations of two types of planar inductor cell structures.
Figure 2B:
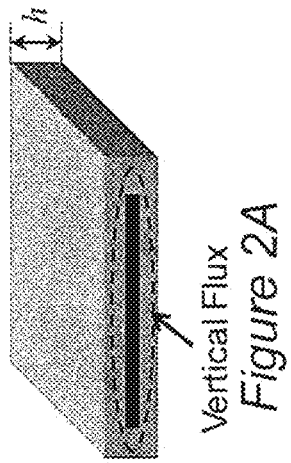

Due to the high aspect ratio corresponding to a desirable low profile of the inductor, the design of the inductor that functions as well as a discrete inductor component is somewhat difficult. In terms of the flux path pattern, possible inductor designs employing magnetic material embedded in a PCB are constrained to being one of two types: a so-called vertical flux type in which magnetic flux in the core has some regions where the flux is perpendicular to the plane of the PCB, and a lateral flux type in which the magnetic flux is entirely in a direction parallel to the plane of the PCB. Basic cells of these two types of inductor designs are illustrated in FIGS. 2A and 2B in which the magnetic material is indicated by relatively lighter shading while a portion of the windings is indicated by relatively darker shading.

As is known, for a given cross-sectional area of a winding, a cylindrical winding yields the shortest magnetic path length. However, if the core thickness or height, h, is limited to a sufficiently small value, a cylindrical winding cannot be used and in order to maintain the same cross-sectional area of the winding to maintain the same winding resistance, an elongated rectangular winding with a higher aspect ratio must be used instead; resulting in increased magnetic reluctance, a decrease in energy density, increased magnetic path length and decoupling of the flux distribution from the core thickness.

Figure 3:
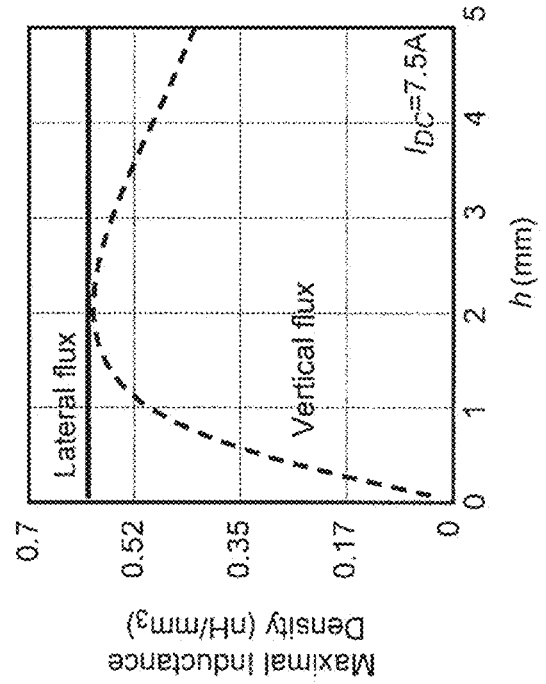
FIGS. 3 and 4 are graphical comparisons of inductance density of the two types of planar inductor cell structures of FIGS. 2A and 2B for different currents and winding cross-sectional areas.
Figure 4:
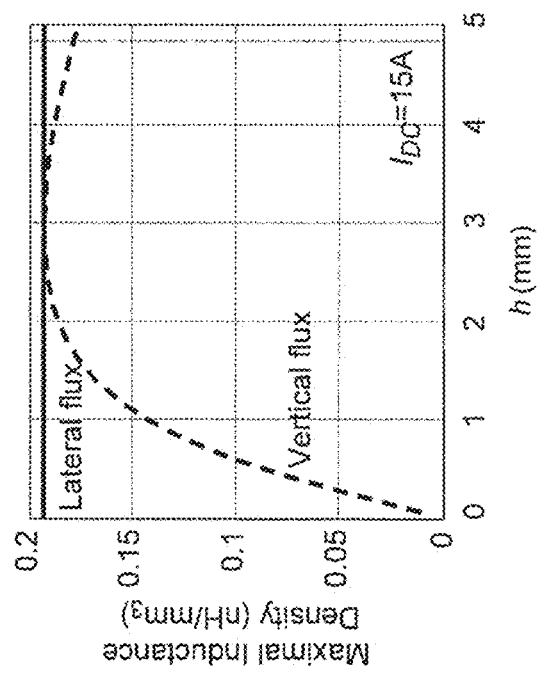

FIGS. 3 and 4 show the maximal coupling inductance that can be achieved as a function of dimension h for inductors of the vertical flux type and lateral flux type and the same winding cross section. In FIG. 3, the inductor current is 15 A and the winding cross-sectional area is 1.5 $mm^2$. In FIG. 4, the inductor current is 7.5 A and the winding cross-sectional area is 0.75 $mm^2$. It can be seen that, for vertical flux type low profile inductors, the maximal inductance is severely affected by inductor thickness or height, h, although an inductance equal to a lateral flux inductor can be achieved. On the other hand, the inductance of a lateral flux type inductor is completely insensitive to h. It should also be appreciated from FIGS. 3 and 4 that if a change in the inductor current is accompanied by a corresponding (e.g. proportional) change in winding cross-sectional area, the optimal core thickness for vertical flux type inductors will also change accordingly. Therefore, a vertical flux inductor structure does not allow flexibility of application to devices having different or variable current requirements for a given inductor design. Thus, for power converters for general applications, a lateral flux structure would clearly be preferable particularly for devices presenting larger loads.

Figure 5C:
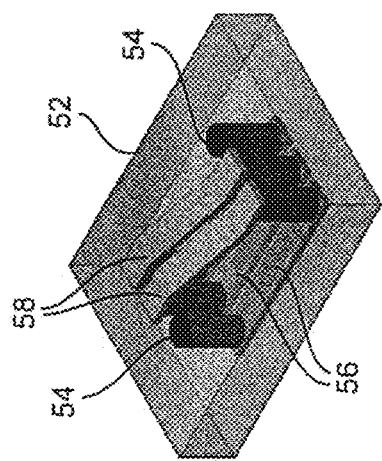
FIGS. 5A, 5B and 5C illustrate construction of windings of different numbers of turns for lateral flux planar inductors.
Figure 5B:
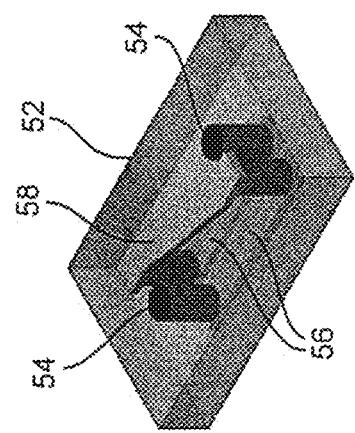
Figure 5A:
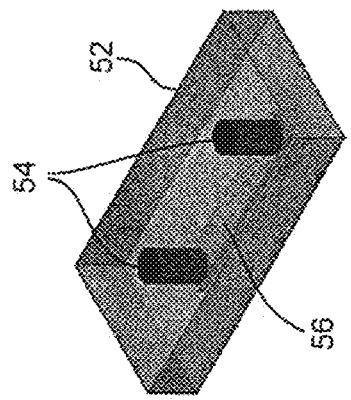

Referring now to FIGS. 5A-5C, structures of lateral flux type inductors having different numbers of turns are illustrated in isometric and semi-transparent views. Each of these inductor structures is comprised of a body of magnetic material 52, each comprising a pair of adjacent basic cells as illustrated in FIG. 2B, vias 54 and bottom connections 56 extending between vias preferably formed by metallization on an insulator covering the magnetic material and, if more than one turn is to be formed, angled connections 58 between the vias on top of the magnetic material. External connections to the terminals of the windings are omitted for clarity in these Figures but are preferably formed of the same metallization as the angled connections 58. Of course, connections could be made directly to the exposed vias 54. This type of structure can be extended to form as many turns as may be desired to increase inductance density but at a cost of increased electrical resistance for a given conductivity of vias and metallization thickness. The connections 56, 58 should be placed as closely together as possible to maximize mutual coupling between turns of the winding. Estimation of inductance and core loss can be made by simulation.

Figure 6:
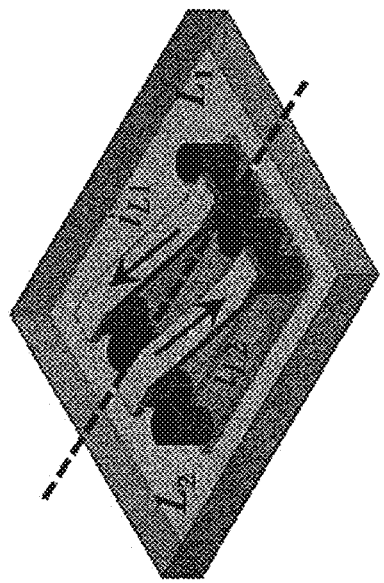
FIG. 6 illustrates an inductor structure having inversely coupled windings.

The performance of the inductor structures of FIGS. 5A-5C can be improved by providing two inversely coupled inductors embedded in the same body of magnetic material as illustrated in FIG. 6. If connections to the respective windings such that the current in the respective windings flows in opposite directions, the flux created in the core by each winding will also be in opposite directions and will largely cancel. Compared with the structures shown in FIGS. 5A-5C, the inverse coupling provides two significant benefits. First, the equivalent transient inductance, which impacts the transient speed of the converter, becomes smaller than the equivalent steady-state inductance, which determines the steady-state ripple of the converter. Therefore, high transient response and high efficiency can be simultaneously obtained. Second, because of the DC flux cancellation, the magnetic core can operate at a lower DC bias condition than an inductor that does not include inverse coupling. Because the permeability of high frequency magnetic materials is usually dependent on the DC bias condition, the incremental permeability at low DC bias is larger than that at a high DC bias condition and the care volume can be reduced because of the larger incremental permeability. Because the maximal inductance density for lateral flux inductors is substantially invariant with core thickness, h, as discussed above, core thickness for inductors having inductor currents of interest (e.g. above about 10 A) without inverse coupling can be reduced below 1 mm without reverse coupling and even further reduced through use of inverse coupling.

In regard to the selection of magnetic materials, several different magnetic materials have been used in various known approaches to low profile inductors embedded in PCBs. Such materials include a ferrite polymer compound (FPC) material, a Permalloy foil and sintered MnZn ferrite, each of which has its own limitations in regard to application to a low profile inductor for relatively high inductor current and high frequency operation. Specifically, the FPC material is preferable in terms of cost and compatibility with PCB manufacturing processes but exhibits higher losses and lower permeability for high frequency operation. Permalloy materials such as NiFe and CoNiFe have very high permeability and saturation flux density but the thickness of the magnetic alloy has to be reduced below 20 μm and laminated with interleaved layers of insulating materials to hold eddy current losses to an acceptable level due to the low resistivity of such materials. The laminating process is complicated and the result is unsuitable for medium to high current applications where a large core volume is needed and cannot, as a practical matter, be achieved in a core that is as thin as is possible using other materials due to the volume occupied by the insulation. MnZn ferrite has high permeability, low core loss density and adequate core thickness at thicknesses suitable for embedding in a PCB but the rigidity and hardness of the ferrite requires special facilities for shaping and patterning the material and thus is not competitive for mass production.

The inventors have found that another material is commercially available and avoids the above problems of unsuitability for low profile power converters. Specifically, magnetic alloys such as the Permalloy materials discussed above can be milled into flakes with a high aspect ratio (e.g. 1 μm thickness and 100 μm lateral dimension). After being coated with $SiO_2$ oxide and being hot pressed with an organic binder such as epoxy, thicknesses from well below 1 mm to several millimeters of the flake composite can be obtained. The flake composite exhibits the same high permeability and high saturation flux density of the original material while the volume of insulator and binder is low in the composite material. The composite material is also soft and can be shaped and cut with ordinary cutting and shaping machines that are common in mass production environments. The only criticality is that the flakes must be aligned in parallel with respect to an external magnetic field to minimize eddy current loss. A suitable material having suitably dimensioned flakes that are suitably aligned is available from NEC-Tokin. While this flaked material is greatly preferred for practice of the invention, commercially available LTCC materials and the like can also be used, particularly if inversely coupled windings are used, as discussed above, to reduce the stringency of requirements for high permeability.

Figure 7A:
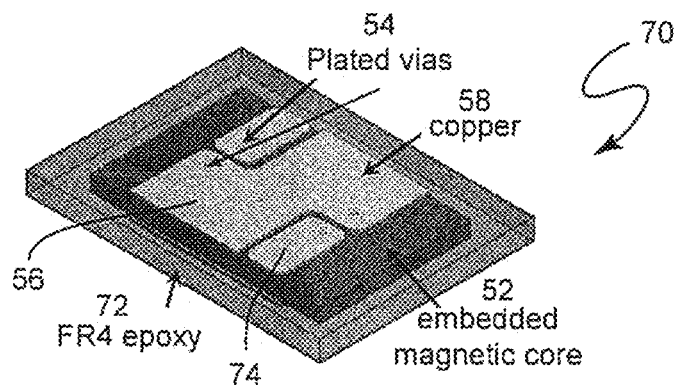
FIG. 7A is an isometric view of a planar inductor structure in accordance with the invention.
Figure 7B:
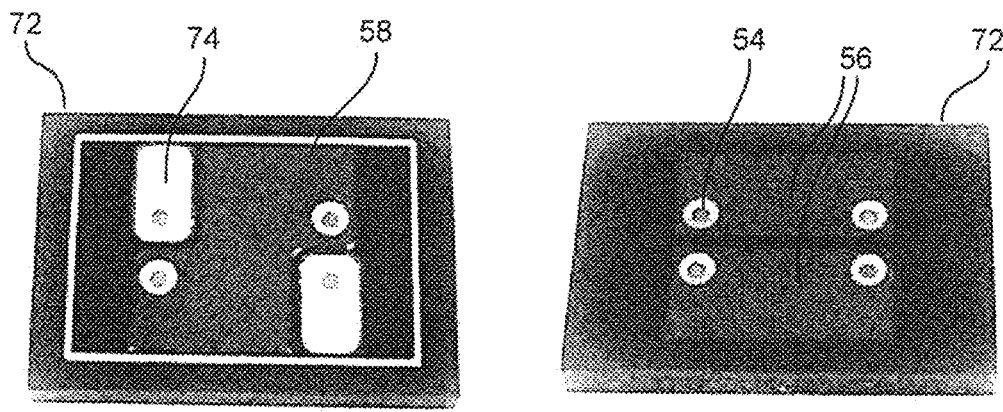
FIG. 7B illustrates top and bottom views of the planar inductor structure of FIG. 7A.

Assuming use of a lateral flux pattern for the reasons discussed above, the structure of an exemplary PCB-embedded two-turn inductor 70 is illustrated in FIGS. 7A and 7B. FIG. 7A is an isometric, semi-transparent view of the inductor design and FIG. 7B shows top and bottom views of a corresponding prototype inductor. It should be understood that while an exemplary two-turn winding is shown, any number of windings could be provided to obtain the required inductance density and inverse coupling could be provided, if desired, to accommodate the permeability of the magnetic material and/or allow reduction of the thickness of the magnetic material 52 embedded in a two-layer PCB laminated structure 72 of, for example, epoxy, with copper layers on the top and bottom from which connections 58 and 56 and terminals 74 are formed, preferably by etching subsequent to formation of vies 54. Vias 54 are formed by drilling, preferably subsequent to the embedding of the magnetic material in the PCB, and plating of the interior of the holes, which also serves to make connections to the copper layers forming connections 74, 56 and 58. This structure can thus form a substrate for supporting other components of the power converter and yet requires no additional volume and no surface area to be provided for the inductor, itself, but only connections thereto. However, as will be discussed below in connection with FIG. 8, a further shielding layer and a further PCB lamina and cladding is preferably added to this structure for forming the low profile, high current power converter in accordance with the invention.

To complete the embedded inductor POL power converter, silicon power devices are preferably used at the present time rather than GaN devices alluded to above since the technology of the former is currently much more mature and of low cost and thus appropriate for industrial production. To achieve high frequency operation commercially available driver MOS, sometimes referred to as DrMos, integrated circuit switches in which the switching transistors are differently optimized to reduce losses for high currents and low voltages, are preferred and have high and low side switches as well as drivers integrated on a single chip and are commonly used in commercial products at the present time. By reducing the parasitic inductance and resistance between each component in these devices, the switching loss can be minimized and the devices can potentially operate at frequencies up to 2 MHz. Such commercially available devices have current ratings of up to 25 A.

Figure 8:
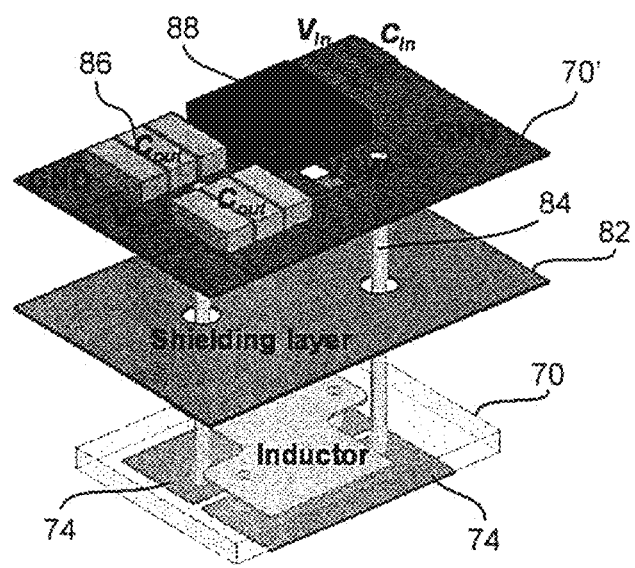
FIG. 8 is an exploded view of a power converter module structure in accordance with the invention.

An exploded view of the preferred layout of the low profile, multi-layer embedded inductor power converter in accordance with the invention is illustrated in FIG. 8. The PCB embedded inductor 70, as discussed above, preferably forms the lower two or more layers. As alluded to above, shielding layer 82 forming a third layer and a further one or more PCB lamina 70' with cladding forming one or fourth or upper layers are additionally laminated thereto. Connections are made from the cladding to the PCB embedded inductor through plated vias 84 (exaggerated in length in this exploded view) terminating on cladding terminals 74. The filter capacitor, C, of FIGS. 1A-1C is preferably formed by a plurality of parallel connected capacitors 86 to maintain a low profile and should be located as closely as possible to the DrMos integrated circuit switches 88 to reduce parasitic capacitance. Conductive shield layer 82 is a complete shield layer and should be as close as possible to the cladding of the top layer by making the additional PCB lamina 70' as thin as possible. The eddy currents induced in the shield layer 82 by high frequency AC current in the switches creates an opposite flux to cancel the flux created by the parasitic loop inductance of the (buck) converter loop. Therefore, the loop inductance and the switching loss can be reduced. Input and output terminals $V_{in}$, $V_{out}$ and GND are preferably formed by etching of the cladding of layer 70'. If the power converter is used as a POL power supply, it is generally desirable to include an input capacitor $C_{in}$ which can be located as illustrated as closely as possible to the DrMOS integrated circuit switches to reduce parasitic capacitance.

The completed multi-layer BCB embedded inductor low profile power converter is illustrated adjacent to a United States Quarter Dollar coin for a comparison of size in FIG. 9. The thicknesses of modules designed for operation at 1.5 MHZ and 2.0 MHZ are only 3.7 mm and 3.5 mm, respectively. The area or footprint of the entire power converter is much less than one square inch. FIG. 10 shows that the efficiency of the power converter in accordance with the invention and operating with a 12V input and 1.2V output is in the range of 80%-88% depending on switching frequency and output current. When the output voltage is increased to 1.8V the efficiency is increased to about 90% as shown in FIG. 11. With an output voltage of 1.2V the low profile POL power converter in accordance with the invention can achieve a power density of 700 W/in$^3$ operating at a switching frequency of 1.5 MHZ and a power density of 800 W/in$^3$ operating at a switching frequency of 2.0 MHZ. This power density achieved by the invention is approximately five to eight times the power density of state of the art alternative for producing comparable current levels and is achieved entirely with well-known and mature manufacturing technology and commercially available magnetic material and capacitor and switch components.

The low profile power converter in accordance with the invention has also been subjected to and industry standard thermal cycling test in order to evaluate the reliability and robustness of the power converter in accordance with the invention. In accordance with the JEDEC standard (JESD22-A104D test condition M) the temperature of the power converter was varied from −40° C. to 150° C. in one-hour cycles. After 600 cycles there was negligible change in efficiency of the low profile power converter in accordance with the invention, as illustrated in FIG. 12; thus validating the reliability of the embedded magnetic core inductor structure and the multi-layer circuit embodiment.

In view of the foregoing, it is clearly seen that the PCB embedded magnetic material inductor, particular magnetic materials and a multi-layer architecture (preferably considered as a four layer architecture and layout can each provide significant increases in power density of power converters capable of delivering currents in the range of 10 A-40 A. However, as discussed above, these factors and design issues can be combined and optimized relative to each other to provide a very significant increase in power density in a low profile package which is applicable to a wide range of current and foreseeable electronic devices and which is capable of being mass produced using only mature technologies which are known to be reliable and commonly available in manufacturing environments. The power converter in accordance with the invention can be applied to any known or foreseeable power converter topology and does not significantly compromise the efficiency of any power converter topology to which the PCB embedded inductor, flaked magnetic material and or—layer architecture may be applied singly or in any combination.

While the invention has been described in terms of a single preferred embodiment, those skilled in the art will recognize that the invention can be practiced with modification within the spirit and scope of the appended claims.

The invention claimed is:

1. A power converter comprising
a switching circuit,
a capacitor, and
an inductor formed of a body of magnetic material embedded in a laminated printed circuit board structure and windings formed by vias connected to areas of cladding on surfaces of said laminated printed circuit board structure, wherein said body of magnetic material is formed of flakes of magnetic material in an insulating binder.

2. A power converter as recited in claim 1, wherein said flakes are oriented in alignment with a magnetic field in said inductor.

3. A power converter as recited in claim 1, wherein said inductor is of the lateral flux type.

4. A power converter as recited in claim 1, wherein windings of said inductor are formed by cladding on lamina of said laminated printed circuit board structure and vias in said laminated printed circuit board structure.

5. A power converter as recited in claim 1, further including a shield layer and a further layer of laminated printed circuit board structure including cladding for supporting and connecting said switching circuit and said capacitor and forming input and output connections.

6. A power converter comprising
a switching circuit,
a capacitor, and
an inductor including a body of magnetic material comprised of a composite formed of flaked magnetic material that has been coated with $SiO_2$ and hot pressed with an organic binder, wherein said body of magnetic material is embedded in a substrate.

7. A power converter as recited in claim 6, wherein a thickness of said flakes of magnetic material is approximately 1 μm and a lateral dimension of said flakes of magnetic material is approximately 100 μm.

8. A power converter as recited in claim 6, wherein said substrate comprises lamina of a laminated printed circuit board structure.

9. A power converter as recited in claim 6, wherein windings of said inductor are formed of cladding on said substrate and vias in said substrate.

10. A power converter as recited in claim 6, wherein windings of said inductor are inversely coupled.

11. A power converter as recited in claim 6, further including a shield layer and a further layer laminated to said substrate, said further layer including cladding for forming input and output connections to said power converter and connections to and between said switching circuit and said capacitor.

12. A power converter as recited in claim 6, wherein said switching circuit comprises two transistors connected as a half-bridge.

13. A power converter as recited in claim 6, wherein said capacitor is comprised of a plurality of capacitors connected in parallel.

14. A power converter having a multi-layer architecture, said multi-layer architecture comprising
one or more lower layers comprising an inductor core laminated between two printed circuit board layers, wherein said inductor core is formed of flakes of magnetic material in an insulating binder,
a shielding layer extending over said one or more lower layers, and
one or more upper layers comprising a further printed circuit board lamina with patterned cladding and supporting switching transistors and at least one capacitor.

15. A power converter as recited in claim 14, further including windings magnetically coupled to said inductor core.

16. A power converter as recited in claim 15, wherein said windings are formed of cladding on said one or more lower layers and vias in said one or more lower layers.

17. A power converter as recited in claim 16, wherein said windings are inversely coupled.

18. A power converter as recited in claim 16, wherein said windings comprise a plurality of turns.

19. A power converter as recited in claim 14, further including connections formed by vias through said one or more upper layers and said shielding layer.

20. A power converter as recited in claim 14, wherein said number of layers of said multi-layer architecture is four.

* * * * *